(12) United States Patent
Chou et al.

(10) Patent No.: US 12,228,598 B2
(45) Date of Patent: Feb. 18, 2025

(54) SYSTEM AND METHOD OF MEASURING CAPACITANCE OF DEVICE-UNDER-TEST

(71) Applicant: TAIWAN SEMICONDUCTOR MANUFACTURING COMPANY LTD., Hsinchu (TW)

(72) Inventors: Mao-Hsuan Chou, Hsinchu County (TW); Ruey-Bin Sheen, Taichung (TW); Chih-Hsien Chang, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 322 days.

(21) Appl. No.: 17/813,633

(22) Filed: Jul. 20, 2022

(65) Prior Publication Data
US 2024/0027504 A1    Jan. 25, 2024

(51) Int. Cl.
  *G01R 27/26*  (2006.01)
  *G01R 31/26*  (2020.01)
  *G01R 31/28*  (2006.01)

(52) U.S. Cl.
  CPC ......... *G01R 27/2605* (2013.01); *G01R 31/26* (2013.01); *G01R 31/2639* (2013.01); *G01R 31/2856* (2013.01)

(58) Field of Classification Search
  CPC .......................... G01R 27/2605; G01R 31/26; G01R 31/2639; G01R 31/028; G01R 31/2856
  See application file for complete search history.

(56) References Cited

U.S. PATENT DOCUMENTS

| | | | | |
|---|---|---|---|---|
| 6,404,222 B1 * | 6/2002 | Fan | ..................... | G01R 27/2605 324/519 |
| 9,772,366 B2 * | 9/2017 | Chou | ..................... | H01L 22/00 |

\* cited by examiner

*Primary Examiner* — Amy He
(74) *Attorney, Agent, or Firm* — WPAT LAW; Anthony King

(57) ABSTRACT

The present disclosure provides a system of measuring capacitance of a device-under-test (DUT). The system includes first switch, second switch, and a capacitance measurement device. The first switch is configured to receive a supply voltage. The first and second switches are electrically connected to the DUT. The capacitance measurement device is configured to provide a first pair of non-overlapping periodic signals with a first frequency, and a second pair of non-overlapping periodic signals with a second frequency. The second frequency is $\beta$ times the first frequency. When the first switch and the second switch receive the first pair of non-overlapping periodic signals, a first current is transmitted through the first switch and the second switch. When the first switch and the second switch receive the second pair of non-overlapping periodic signals, a second current is transmitted through the first switch and the second switch.

20 Claims, 9 Drawing Sheets

SYSTEM AND METHOD OF MEASURING CAPACITANCE OF DEVICE-UNDER-TEST

BACKGROUND

The characteristics of a device, such as an active device or passive device, in circuitry must be correctly measured to avoid offset of the characteristics severely impacting function of the circuitry. However, as trends dictate constant reduction in device sizes, device characteristics become increasingly difficult to measure.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features may be arbitrarily increased or reduced for clarity of discussion.

DETAILED DESCRIPTION

Figure 1:
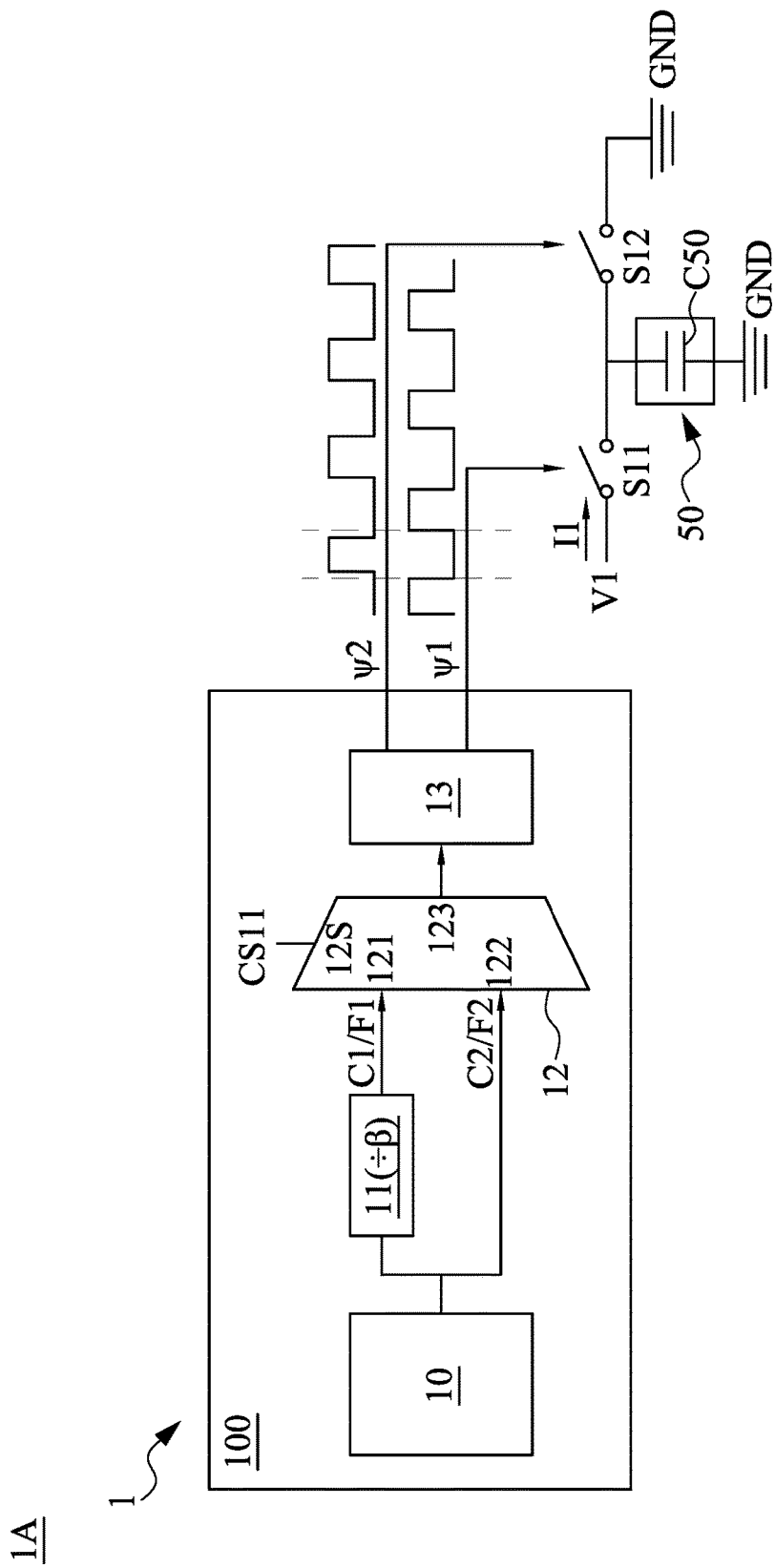
FIG. 1 is a block diagram of configuration of a system of measuring capacitance of a device-under-test (DUT), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

Figure 2:
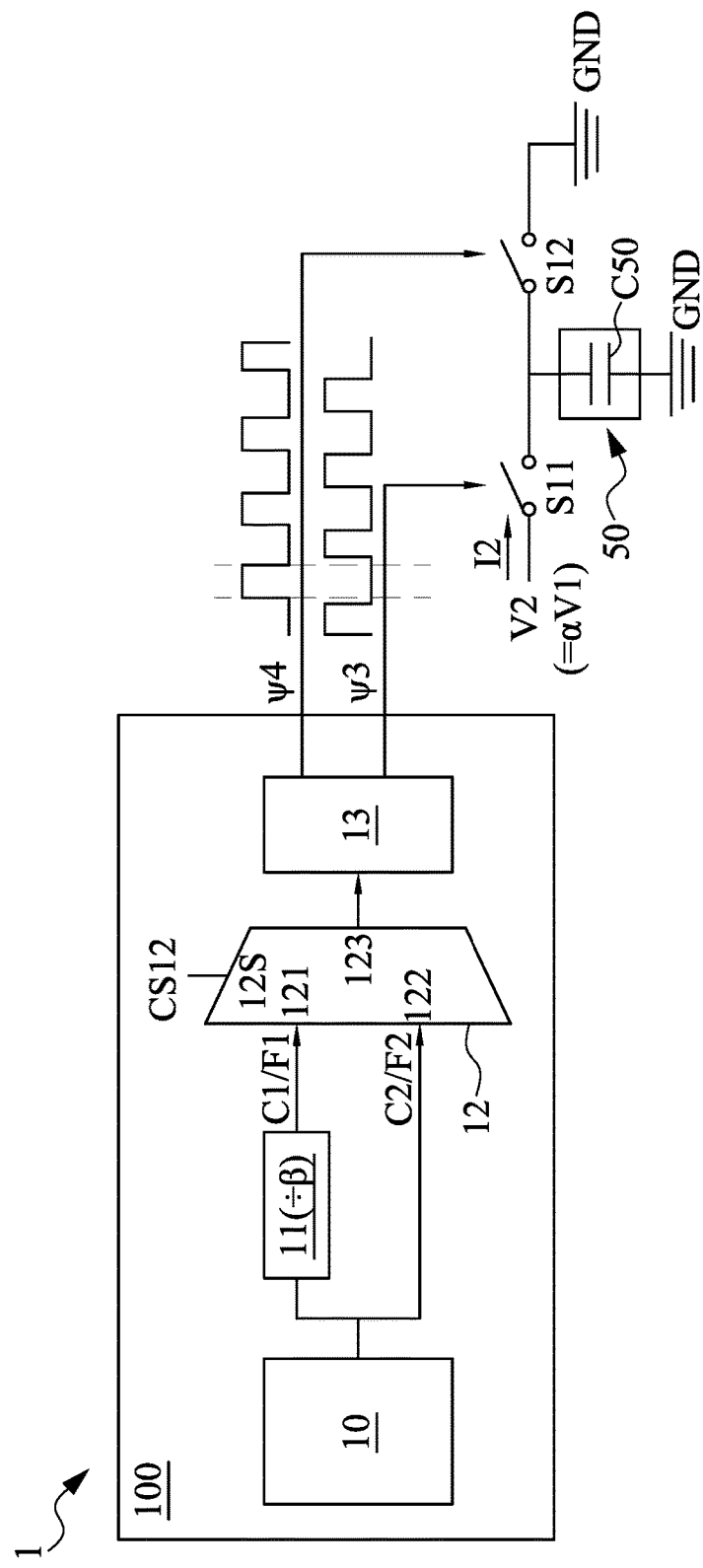
FIG. 2 is a block diagram of configuration of a system of measuring capacitance of a DUT, in accordance with some embodiments.

FIG. 1 is a block diagram of a first configuration 1A of a system 1 of measuring capacitor C50 of a device-under-test (DUT) 50 (e.g., a capacitor or any device including real or parasitic capacitors), in accordance with some embodiments. FIG. 2 is a block diagram of a second configuration 1B of the system 1 of measuring capacitor C50 of the DUT 50, in accordance with some embodiments. The system 1 includes a capacitance measurement device 100, a switch S11, and a switch S12.

The switch S11 has a first terminal configured to receive an external signal and a second terminal electrically connected to a first terminal of the DUT 50. In the first configuration 1A, the first terminal of the switch S11 is configured to receive a supply voltage V1. In the second configuration 1B, the first terminal of the switch S1 is configured to receive a supply voltage V2. The supply voltage V2 is $\alpha$ times the supply voltage V1, wherein $\alpha$ can be an integer, for example, 1, 2, 5, 10, or other. The switch S12 has a first terminal electrically connected to the first terminal of the DUT 50 and a second terminal electrically connected to a ground GND. The DUT 50 has a second terminal electrically connected to the ground GND.

The capacitance measurement device 100 includes a clock generator 10, a frequency divider 11, a multiplexer 12, and a phase-shifting module 13. The clock generator 10 is electrically connected to the frequency divider 11. The frequency divider 11 electrically connects the clock generator 10 and the multiplexer 12. The clock generator 10 is electrically connected to the multiplexer 12. The multiplexer 12 is electrically connected to the frequency divider 11.

The clock generator 10 is configured to generate a clock C2 having a frequency F2. The clock C2 may include a square wave or a sinusoidal wave. The clock C2 may include periodic signals. The clock C2 may include a pulse train. The clock generator 10 may include a ring oscillator.

The frequency divider 11 is configured to divide or reduce the frequency F2 of the clock C2 into a frequency F1 to generate a frequency-divided clock C1 having the frequency F1. The frequency F2 is $\beta$ times the frequency F1, wherein $\beta$ can be an integer such as 1, 2, 5, 10, or other. The frequency F2 is greater than the frequency F1. The frequency divider 11 may include a square wave divider, a regenerative frequency divider, a locked-oscillator frequency divider, or any other frequency dividers.

The multiplexer 12 has a first input terminal 121 and a second input terminal 122, an output terminal 123, and a control terminal 12S. The first input terminal 121 of the multiplexer 12 is configured to receive the clock C1 having the frequency F1. The second input terminal 122 of the multiplexer 12 is configured to receive the frequency-divided clock C2 having the frequency F2. The control terminal 12S is configured to receive a control signal. In the first configuration 1A of FIG. 1, the multiplexer 12, upon receipt of a first control signal CS11 by the control terminal 12S, outputs the frequency-divided clock C1 at the output terminal 123.

The phase-shifting module 13 is configured to receive a clock (e.g., the clock C1 or the frequency-divided clock C2) to generate two non-overlapping clocks (or periodic signals). In the first configuration 1A of FIG. 1, the phase-shifting module 13 generates a first pair of non-overlapping periodic signals ψ1 and ψ2 when receiving the frequency-divided clock C1 from the multiplexer 12. The first pair of non-overlapping periodic signals ψ1 and ψ2 has the frequency F1. The first pair of non-overlapping periodic signals ψ1 and ψ2 include a first periodic signal ψ1 and a second periodic signal ψ2 running at the frequency F1. The first periodic signal ψ1 and the second periodic signal ψ2 may be non-overlap clock signals. The duty cycle of the first pair of non-overlapping periodic signals ψ1 and ψ2 may be less than 50%. A plurality of pulses of the first periodic signal ψ1 and a plurality of pulses of the second periodic signal ψ2 are non-overlapping in the time domain. At a point between the pulses of the first and second periodic signals ψ1 and ψ2, neither is high. For example, the second periodic signal ψ2 may be shifted from the first periodic signal ψ1 by a half period.

In some embodiments, the capacitance measurement device 100 is configured to provide the first pair of non-overlapping periodic signals ψ1 and ψ2 with the frequency F1.

In the first configuration 1A of FIG. 1, the switch S11 and the switch S12 receive the first pair of non-overlapping periodic signals ψ1 and ψ2, and the first terminal of the switch S11 receives the supply voltage V1. In some embodiments, when the switch S1 and the switch S12 receive the first pair of non-overlapping periodic signals ψ1 and ψ2, the supply voltage V1 is applied on or received by the first terminal of the switch S11. In some embodiments, the receiving of the first pair of non-overlapping periodic signals ψ1 and ψ2 and the receiving of the supply voltage V1 overlap in a time domain. In some embodiments, the receiving of the first pair of non-overlapping periodic signals ψ1 and ψ2 by the switch S11 and the receiving of the switch S12 and the supply voltage V1 by the first terminal of the switch S11 occur simultaneously. The timing of the application (or reception) of the first pair of non-overlapping periodic signals ψ1 and ψ2 and the supply voltage V1 can be controlled by the control signal CS11 and an external oscilloscope.

The switch S11 receives the first periodic signal ψ1. The switch S12 receives the second periodic signal ψ2. Based on the first pair of non-overlapping periodic signals ψ1 and ψ2, the first configuration 1A of the system 1 is configured to perform a plurality of charge-discharge cycles. In some embodiments, the switch S11 and the switch S12 may be a transistor. In the charge portion of a charge-discharge cycle, the switch S11 is turned on when the first periodic signal ψ1 is logic high and the switch S12 is turned off when the second periodic signal ψ2 is logic low. The supply voltage V1 is coupled to the DUT 50 via the turned-on switch S11 to charge the capacitor C50 of the DUT 50. In the discharge portion of a charge-discharge cycle, the switch S11 is turned off when the first periodic signal ψ1 is logic low and the switch S12 is turned on when the second periodic signal ψ2 is logic high. The DUT 50 is coupled to the ground GND via the switch S12 to discharge the capacitor C50 of the DUT 50. When the switch S11 and the switch S12 receive the first pair of non-overlapping wave functions ψ1 and ψ2, a current I1 is transmitted through the switch S11 and the switch S12. By performing a plurality of charge-discharge cycles, the current I1 transmitted through the switch S11 and switch S12 can be obtained or measured. The current I1 may be an average charge current obtained or measured during the plurality of charge-discharge cycles. The relationship between the supply voltage V1, current I1, and the frequency F1 of the first pair of non-overlapping periodic signals ψ1 and ψ2 is determined by the following formula (1).

$$(V_1 + V_{er1}) \times (F_1 + F_{er1}) = \frac{I_1 + I_{er1}}{C} \quad (1)$$

$V_{er1}$ represents the error in supply voltage V1, $F_{er1}$ represents the error in frequency F1, $I_{er1}$ represents the error in measured current I1, and C is the measured capacitance of capacitor C50 of the DUT 50. One or more of the errors may influence accuracy of the measured capacitance of capacitor C50 of the DUT 50.

In order to obtain a more accurate measured capacitance C of the DUT 50, the present disclosure provides a plurality of configurations (e.g., the first configuration 1A and the second configuration 1B) to minimize the influence of errors on the measured capacitance C of the DUT 50.

In the second configuration 1B of FIG. 2, the multiplexer 12, upon receipt of a second control signal CS12 by the control terminal 12S, outputs the clock C2 at the output terminal 123.

In the second configuration 1B of FIG. 2, the phase-shifting module 13 generates a second pair of non-overlapping periodic signals ψ3 and ψ4 when receiving the clock C2 from the multiplexer 12. The second pair of non-overlapping periodic signals ψ3 and ψ4 has the frequency F2. The second pair of non-overlapping periodic signals ψ3 and ψ4 has a third periodic signal ψ3 and a fourth periodic signal ψ4 running at the frequency F2. The third periodic signal ψ3 and the fourth periodic signal ψ4 may be non-overlap clock signals. The duty cycle of the second pair of non-overlapping periodic signals ψ3 and ψ4 may be less than 50%. A plurality of pulses of the third periodic signal ψ3 and a plurality of pulses of the fourth periodic signal ψ4 are non-overlapping in the time domain. At a point between the pulses of the third and fourth periodic signals ψ3 and ψ4, neither is high. For example, the fourth periodic signal ψ4 may be shifted from the third periodic signal ψ3 by a half period.

In the second configuration 1B of FIG. 2, the switch S11 and the switch S12 receive the second pair of non-overlapping periodic signals ψ3 and ψ4, and the first terminal of the switch S11 receives the supply voltage V2. In some embodiments, when the switch S1 and the switch S12 receive the second pair of non-overlapping periodic signals ψ3 and ψ4, the supply voltage V2 is applied on or received by the first terminal of the switch S11. In some embodiments, the receiving of the second pair of non-overlapping periodic signals ψ3 and ψ4 and the receiving of the supply voltage V2 overlap in a time domain. In some embodiments, the receiving of the second pair of non-overlapping periodic signals ψ3 and ψ4 by the switch S11 and the switch S12 and the receiving of the supply voltage V2 by the first terminal of the switch S11 occur simultaneously. The timing of the application (or reception) of the second pair of non-overlapping periodic signals ψ3 and ψ4 and the supply voltage V2 can be controlled by the control signal CS12 and an external oscilloscope.

The switch S1 receives the third periodic signal ψ3. The switch S12 receives the fourth periodic signal ψ4. Based on the second pair of non-overlapping periodic signals ψ3 and ψ4, the second configuration 1B of the system 1 is configured to perform a plurality of charge-discharge cycles. In the charge portion of a charge-discharge cycle, the switch S1 is turned on when the third periodic signal ψ3 is logic high and the switch S12 is turned off when the fourth periodic signal ψ4 is logic low. The supply voltage V2 is coupled to the DUT 50 via the turned-on switch S11 to charge the capacitor C50 of the DUT 50. In the discharge portion of a charge-discharge cycle, the switch S1 is turned off when the third periodic signal ψ3 is logic low and the switch S12 is turned on when the fourth periodic signal ψ4 is logic high. The DUT 50 is coupled to the ground GND via the switch S12 to discharge the capacitor C50 of the DUT 50. When the switch S11 and the switch S12 receive the second pair of non-overlapping wave functions ψ3 and ψ4, a current I2 is transmitted through the switch S11 and the switch S12. By performing a plurality of charge-discharge cycles, the current I2 transmitted through the switch S11 and switch S12 can be obtained or measured. The current I2 may be an average charge current obtained or measured during the plurality of charge-discharge cycles. The relationship between the supply voltage V2, current I2, and the frequency F2 of the second pair of non-overlapping periodic signals ψ3 and ψ4 is determined by the following formula (2).

$$(V_2 + V_{er2}) \times (F_2 + F_{er2}) = \frac{I_2 + I_{er2}}{C} \tag{2}$$

$V_{er2}$ represents the error in supply voltage V2, $F_{er2}$ represents the error in frequency F2, $I_{er2}$ represents the error in measured current I2, and C is the measured capacitance of capacitor C50 of the DUT 50. One or more of the errors may influence accuracy of the measured capacitance of capacitor C50 of the DUT 50. In the present disclosure, the influence of the errors can be minimized.

The formula (1) which represents the relationship determined by the first configuration 1A can be transformed by expanding the left half to provide the following formula (3).

$$V_1 F_1 + V_{er1} F_1 + V_1 F_{er1} + V_{er1} F_{er1} = \frac{I_1 + I_{er1}}{C} \tag{3}$$

As previously mentioned, the supply voltage V2 is α times the supply voltage V1 and the frequency F2 is β times the frequency F1. Thus, the formula (2) which represents the relationship determined by the second configuration 1B can be transformed by expanding the left half to provide the following formula (4).

$$\alpha\beta V_1 F_1 + \beta V_{er2} F_1 + \alpha V_1 F_{er2} + V_{er2} F_{er2} = \frac{I_2 + I_{er2}}{C} \tag{4}$$

In order to reduce the influence of the errors $V_{er1}$, $V_{er2}$, $F_{er1}$, $F_{er2}$, $I_{er1}$, and $I_{er2}$, the following calculation takes the advantage of the factors α and β by subtracting the formula (4) with the formula (3) to provide the following formula (5).

$$(\alpha\beta - 1)V_1 F_1 + (\beta V_{er2} - V_{er1})F_1 + \tag{5}$$
$$(\alpha F_{er2} - F_{er1})V_1 + V_{er2}F_{er2} - V_{er1}F_{er1} = \frac{I_2 - I_1 + I_{er2} - I_{er1}}{C}$$

The measured capacitance C of the DUT 50 can be determined by organizing the formula (5) to provide the following formula (6).

$$C = \frac{I_2 - I_1 + I_{er2} - I_{er1}}{(\alpha\beta - 1)V_1 F_1 + (\beta V_{er2} - V_{er1})F_1 + (\alpha F_{er2} - F_{er1})V_1 + V_{er2}F_{er2} - V_{er1}F_{er1}} \tag{6}$$

By varying the factors α and β, the errors in the formula (6) can be cancelled or ignored. The error $V_{er1}$ can substantially equal the error $V_{er2}$; the error $F_{er1}$ can substantially equal the error $F_{er2}$; the error $I_{er1}$ can substantially equal the error $I_{er2}$. When the supply voltage V1 and the supply voltage V2 having the same value are respectively applied on or received by the first terminal of the switch S11 in the configurations 1A and 1B, the factor α is set to be 1 and the formula (6) approximates the following formula (7).

$$C = \frac{I2 - I1}{(\beta - 1) * V1 * F1} \tag{7}$$

The error terms of $(\alpha F_{er2} - F_{er1})V1$, $V_{er2}F_{er2}$, $V_{er1}F_{er1}$ are cancelled and the error terms $(\beta V_{er2} - V_{er1})F1$ (approximating $(\beta-1)*V_{er1}*F1$) can be ignored when $V_{er1}$ and $V_{er2}$ are relatively less than V1. The capacitance C of the DUT 50 can be accurately obtained or measured based on the calculation of the formula (7).

In some embodiments, when the supply voltage V1 and the supply voltage V2 (i.e., αV1) having different values are respectively applied on or received by the first terminal of the switch S11 in the configurations 1A and 1B, the formula (6) approximates the following formula (8).

$$\frac{I2 - I1}{(\alpha\beta - 1) * V1 * F1} \tag{8}$$

The error terms of $V_{er2}F_{er2}$, $V_{er1}F_{er1}$ are cancelled. The error term $(\beta V_{er2} - V_{er1})F1$ can approximate $(\beta-1)*V_{er1}*F1$, which has a weighting factor of $(\beta-1)$. The error term $(\alpha F_{er2} - F_{er1})V1$ can approximate $(\alpha-1)*F_{er1}*V1$, which has a weighting factor of $(\alpha-1)$. The error terms $(\beta-1)*V_{er1}*F1$ and $(\alpha-1)*F_{er1}*V1$ can be ignored since the given term V1F1 has a weighting factor of $(\alpha*\beta-1)$ relatively higher than the weighting factors $(\alpha-1)$ and $(\beta-1)$. The capacitance C of the DUT 50 can be accurately obtained or measured based on the calculation of the formula (7). In the case that the actual value of the capacitance C of the DUT 50 is in the order of fF, or 0.1 fF, the measurement error in capacitance C of the DUT 50 can be less than 10% when the factor α and the factor β are set to 10. Furthermore, the measurement of the present disclosure is independent of production verification test (PVT) variation.

Figure 3:
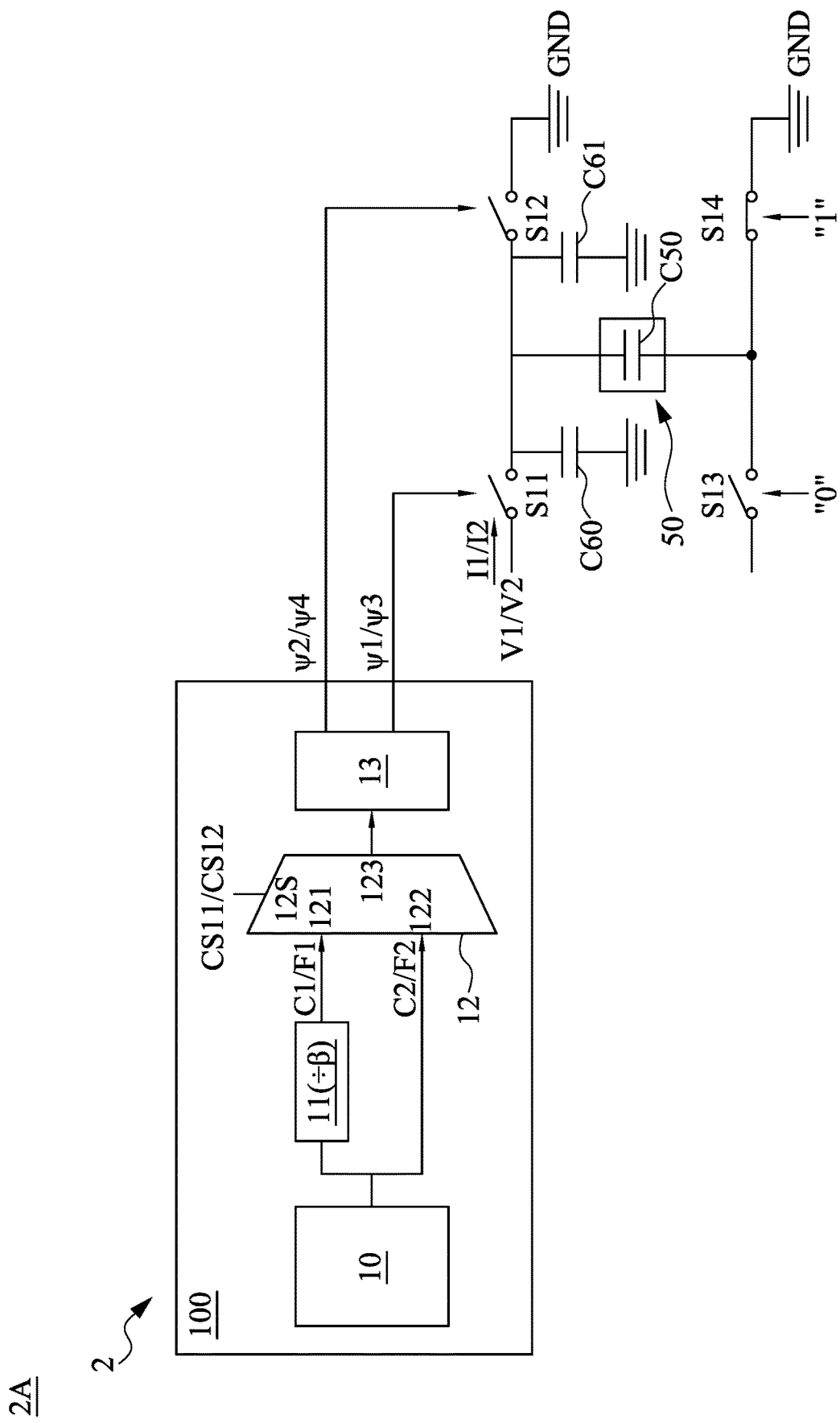
FIG. 3 is a block diagram of configuration of a system of measuring capacitance of a DUT, in accordance with some embodiments.
Figure 4:
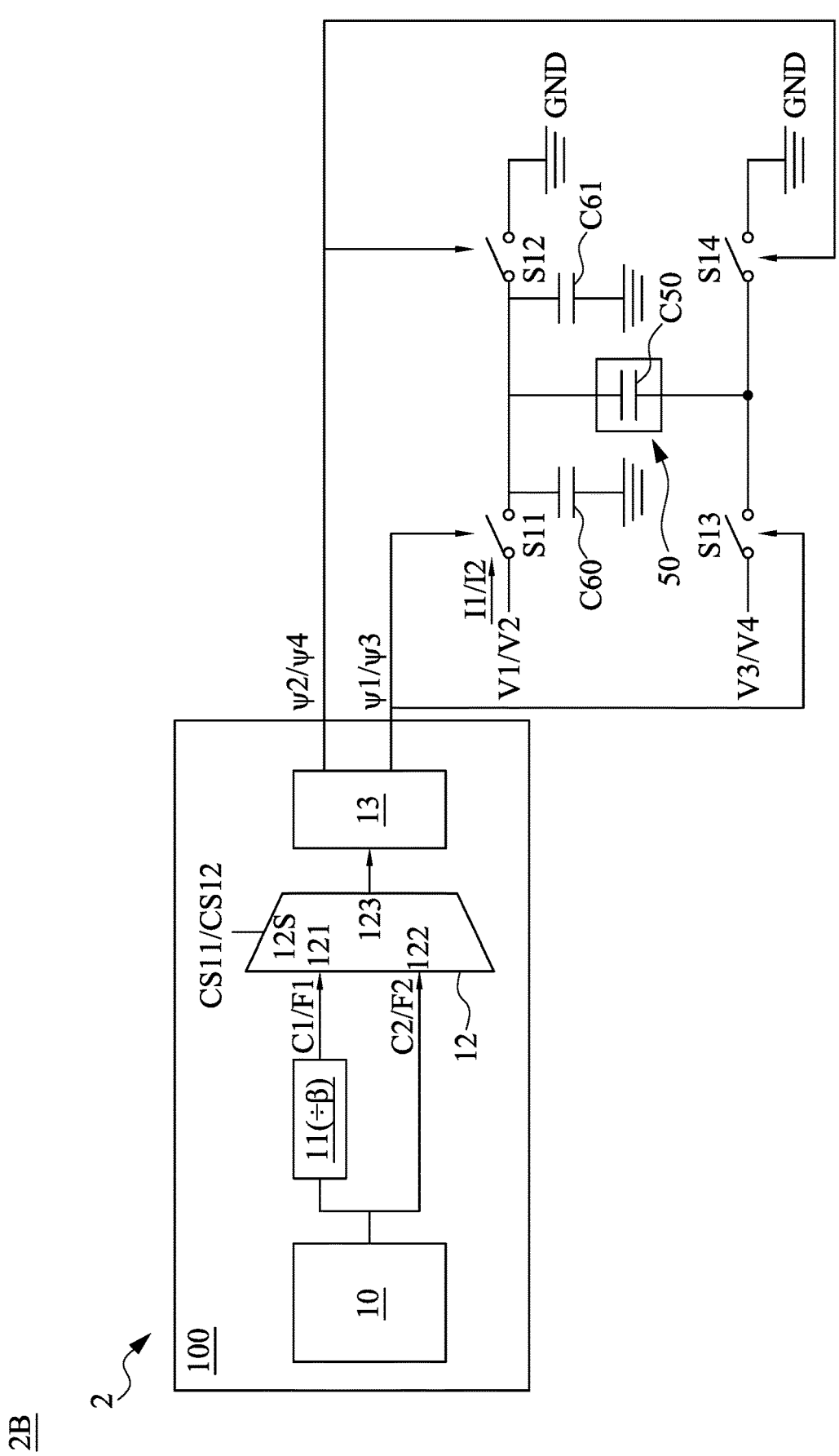
FIG. 4 is a block diagram of configuration of a system of measuring capacitance of a DUT, in accordance with some embodiments.

FIG. 3 is a block diagram of a configuration 2A of a system 2 of measuring the capacitance of capacitor C50 of the DUT 50, in accordance with some embodiments. FIG. 4 is a block diagram of a configuration 2B of the system 2 of measuring the capacitance of the DUT 50, in accordance with some embodiments. The configuration 2A of the system 2 of FIG. 3 is similar to the first configuration 1A and the second configuration 1B of the system 1 of FIGS. 1 and 2. As shown in FIGS. 3 and 4, the switch S11 may have parasitic capacitance which is represented by an imaginary capacitor C60 connected to the ground GND. The switch S12 may have parasitic capacitance which is represented by an imaginary capacitor C61 connected to the ground GND. The parasitic capacitance C60 and C61 of the switches S11 and S12 may influence accuracy of the measurement of the capacitance C50 of the DUT 50. The configuration 2A of the system 2 of FIG. 3 and the configuration 2B of the system 2 of FIG. 4 can be implemented to minimize or eliminate the influence of the parasitic capacitance C60 and C61 of the switches S11 and S12.

The difference between the system 2 of FIGS. 3 and 4 and the system 1 of FIGS. 1 and 2 is discussed in the following paragraphs. In FIG. 3, the system 2 further includes a switch S13 electrically connected to the second terminal of the DUT 50. The system 2 further includes a switch S14 having a first terminal electrically connected to the switch S13 and the second terminal of the DUT 50 and a second terminal electrically connected to the ground GND. The switch S13 and the switch S14 may include a transistor.

In the first configuration 2A of the system 2, the switch S13 is turned off by receiving a logic low signal, e.g. "0," and the switch S14 is turned on by receiving a logic high signal, e.g., "1." In an alternative embodiment, the switch S13 is turned off by receiving a logic high signal, e.g. "1," and the switch S14 is turned on by receiving a logic low signal, e.g., "0." The similar capacitance measurement of the first configuration 1A and the second configuration 1B of the system 1 can be performed in the first configuration 2A of the system 2. However, the measured capacitance of the DUT 50 may include the parasitic capacitances C60 and C61 of the switches S1 and S2. The system 2 of the present disclosure can extract the parasitic capacitance C60 and C61 to obtain or measure the real capacitance of the DUT 50.

In the second configuration 2B of the system 2, the switch S13 has a first terminal configured to receive a supply voltage V3 or a supply voltage V4 and a second terminal electrically connected to the second terminal of the DUT 50. The supply voltage V4 is α times the supply voltage V3. The supply voltage V3 and the supply voltage V1 have the same value. The supply voltage V3 and the supply voltage V1 are from different independent sources. The supply voltage V4 and the supply voltage V2 have the same value. The supply voltage V4 and the supply voltage V2 are from different independent sources. The receiving of the supply voltage V1 by the switch S11 and the receiving of the supply voltage V3 by the switch S13 overlap in a time domain. The supply voltage V1 is applied on or received by the switch S11 simultaneously with the supply voltage V3 being applied on or received by the switch S13. The receiving of the supply voltage V2 by the switch S11 and the receiving of the supply voltage V4 by the switch S13 overlap in a time domain. The supply voltage V2 is applied on or received by the switch S11 simultaneously with the supply voltage V4 being applied on or received by the switch S13. The timing of the application or the reception of the supply voltages V1, V2, V3, and V4 can be controlled by a processor (not shown).

In some embodiments, when the switches S11, S12, S13, and S14 receive the first pair of non-overlapping periodic signals ψ1 and ψ2, the supply voltage V1 and the supply voltage V3 are respectively applied on or received by the first terminal of the switch S11 and the first terminal of the switch S13. In some embodiments, the first periodic signal ψ1 is received by the switches S11 and S13 and the second periodic signal ψ2 is received by the switches S12 and S14. In some embodiments, the receiving of the first pair of non-overlapping periodic signals ψ1 and ψ2 and the receiving of the supply voltage V1 and the supply voltage V3 overlap in a time domain. In some embodiments, the receiving of the first pair of non-overlapping periodic signals ψ1 and ψ2 by the switches S11, S12, S13, and S14 and the receiving of the supply voltage V1 and the supply voltage V3 respectively by the first terminal of the switch S11 and the first terminal of the switch S13 occur simultaneously.

When the switches S11, S12, S13, and S14 receive the first pair of non-overlapping periodic signals ψ1 and ψ2, only the parasitic capacitances C60 and C61 of the switches S11 and S12 are measured because the two terminals of the DUT 50 are coupled to the same potential (e.g., the supply voltage V1 and the supply voltage V3).

In some embodiments, when the switches S11, S12, S13, and S14 receive the second pair of non-overlapping periodic signals ψ3 and ψ4, the supply voltage V2 and the supply voltage V4 are respectively applied on or received by the first terminal of the switch S1 and the first terminal of the switch S13. In some embodiments, the third periodic signal ψ3 is received by the switches S11 and S13 and the fourth periodic signals ψ4 is received by the switches S12 and S14. In some embodiments, the receiving of the second pair of non-overlapping periodic signals ψ3 and ψ4 and the receiving of the supply voltage V2 and the supply voltage V4 overlap in a time domain. In some embodiments, the receiving of the second pair of non-overlapping periodic signals ψ3 and ψ4 by the switches S11, S12, S13, and S14 and the receiving of the supply voltage V2 and the supply voltage V4 respectively by the first terminal of the switch S11 and the first terminal of the switch S13 occur simultaneously.

When the switches S11, S12, S13, and S14 receive the second pair of non-overlapping periodic signals ψ3 and ψ4, only the parasitic capacitances C60 and C61 of the switches S11 and S12 are measured because the two terminals of the DUT 50 are coupled to the same potential (e.g., the supply voltage V2 and the supply voltage V4).

In the configuration 2B of the system 2, the parasitic capacitance C60 and C61 can be calculated based on one or more of formulae (1)-(8). Therefore, the measured capacitance of the DUT 50 in the configuration 2A of the system 2 can be corrected by subtracting the parasitic capacitances C60 and C61 of the switch S11 and the switch S12 by the following formula (9).

$$C_{DUT} = C_{TOTAL} - C_{PARASITIC} \quad (9),$$

$C_{TOTAL}$ is the measured capacitance in the configuration 2A and the $C_{PARASITIC}$ is the measured capacitance in the configuration 2B. A more accurate capacitance of the DUT 50 can be measured.

Figure 5:
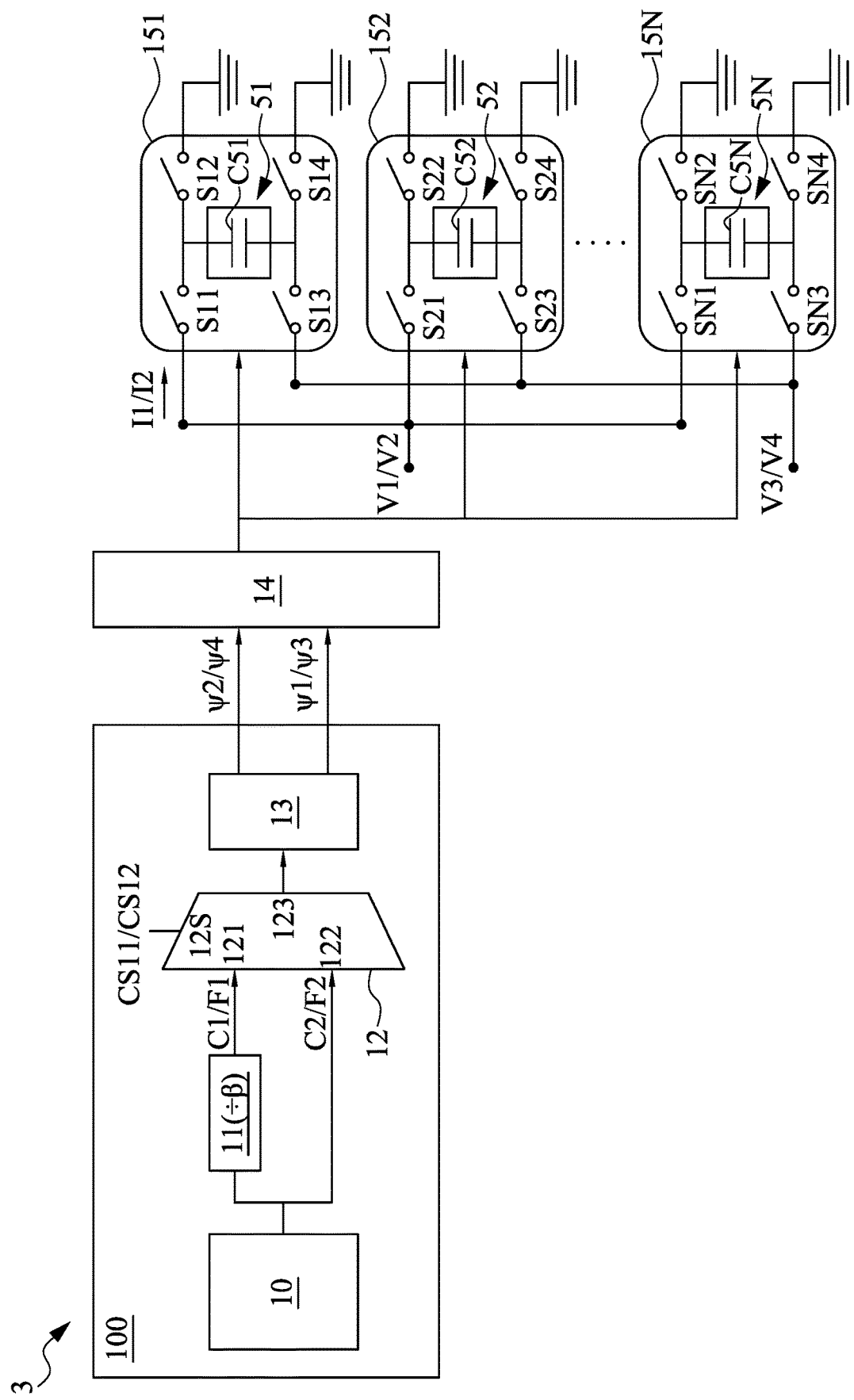
FIG. 5 is a block diagram of configuration of a system of measuring capacitance of a DUT, in accordance with some embodiments.

FIG. 5 is a block diagram of a system of measuring capacitance of a plurality of DUTs 51, 52, . . . 5N, wherein N is an integer, in accordance with some embodiments. The plurality of DUTs 51, 52 . . . , 5N may be an array of capacitors in a circuitry, for example, a successive approximation register (SAR) analog-to-digital converter (ADC). The capacitances of the DUTs may be different. For example, a capacitor C52 of the DUT 52 may have a capacitance twice that of a capacitor C51 of the DUT 51. For example, a capacitor C5N of the DUT 5N may have a capacitance $2^{N-1}$ times that of a capacitor C51 of the DUT 51.

The system 3 includes the capacitance measurement device 100, a controller 14, a plurality of switches S11, S21, ..., SN1, a plurality of switches S12, S22, ..., SN2, a plurality of switches S13, S23, ..., SN3, a plurality of switches S14, S24 ..., SN4. The capacitance measurement device 100 of the system 3 of FIG. 5 is similar to the capacitance measurement device 100 of the system 1 of FIG. 1. The controller 14 is electrically connected to the capacitance measurement device 100. In some embodiments, the controller 14 is integrated into the capacitance measurement device 100.

The switches S11, S21, S31, and SN1 each have a first terminal configured to receive the supply voltage V1 or the supply voltage V2 and a second terminal electrically connected to a first terminal of a corresponding one of DUTs 51, 52, ..., 5N. The switches S12, S22, S32, and SN2 each have a first terminal electrically connected to the first terminal of the corresponding DUT and a second terminal electrically connected to the ground. The switches S13, S23, S33, and SN3 each have a first terminal configured to receive the supply voltage V3 or the supply voltage V4 and a second terminal electrically connected to a second terminal of a corresponding one of DUTs 51, 52, ..., 5N. The switches S14, S24, S34, and SN4 each have a first terminal electrically connected to the second terminal of the corresponding DUT and a second terminal electrically connected to the ground.

The switch S11, the switch S12, the switch S13, and the switch S14 may collectively refer to a switching unit 151. The switch S21, the switch S22, the switch S23, and the switch S24 may collectively refer to a switching unit 152. Similarly, the switch SN1, the switch SN2, the switch SN3, and the switch SN4 may collectively refer to a switching unit 15N.

The controller 14 is configured to receive the first pair of non-overlapping periodic signals ψ1 and ψ2 or the second pair of non-overlapping periodic signals ψ3 and ψ4 from the capacitance measurement device 100. The controller 14 is configured to control which one of the switching units 151, 152, ..., 15N should receive the first pair of non-overlapping periodic signals ψ1 and ψ2 or the second pair of non-overlapping periodic signals ψ3 and ψ4. The controller 14 may include a decoder to control the switching units 151, 152, ..., 15N by one hot encoding (e.g., measuring an individual DUT) or thermometer code (e.g., measuring one or more DUTs, such as DUT 51, DUTs 51 and 52, or DUTs 51, 52, and 5N). The controller is configured to determine a DUT to be measured from the DUTs 51, 52, ..., 5N. The measurement of the capacitance of the to-be-measured DUT is similar to those presented in the configurations 1A and 1B. In some embodiments, the switches S13, S23, SN3 can remain off and the switches S14, S24, SN4 on to mimic the configurations 1A and 1B of the system 1. When the switches (e.g., the switches S11 and S12) corresponding to the measured DUT (e.g., the DUT 51) receive the first pair of non-overlapping periodic signals ψ1 and ψ2 with the frequency F1 and the first terminal of the switch (e.g., the switch S11) receives the supply voltage V1, a current, I1, is transmitted through the switches. When the switches (e.g., the switches S11 and S12) corresponding to the measured DUT (e.g., the DUT 51) receive the second pair of non-overlapping periodic signals ψ3 and ψ4 with the frequency F2 and the first terminal of the switch (e.g., the switch S11) receives the supply voltage V2, a current, I2, is transmitted through the switches. Although there may be leak current from other switching units, the leak current is part of error terms which can be thus ignored by using the weighting factor (α*β−1). The measured capacitance of the measured DUT is calculated based on one or more of the formulae (6), (7), or (8) as previously discussed. The measurement error in capacitance of the DUTs 51, 52, ..., 5N can be less than 10%.

The measurement of the capacitance of the to-be-measured DUT is similar to the configurations 2A and 2B. In some embodiments, the switches S13, S23, S33, SN3 and the switches S14, S24, S34. SN4 are configured to receive the first pair of non-overlapping periodic signals ψ1 and ψ2 or the second pair of non-overlapping periodic signals ψ3 and ψ4. When the switches (e.g., the switches S11, S12, S13, and S14) corresponding to the measured DUT (e.g., the DUT 51) are controlled by the controller 14 to receive the first pair of non-overlapping periodic signals ψ1 and ψ2 with the frequency F1 and the first terminal of the switches (e.g., the switch S11 and the switch S13) respectively receives the supply voltage V1 and the supply voltage V3, the parasitic capacitance of the switches is measured. When the switches (e.g., the switches S11, S12, S13, and S14) corresponding to the measured DUT (e.g., the DUT 51) is controlled by the controller 14 to receive the second pair of non-overlapping periodic signals ψ3 and ψ4 with the frequency F2 and the first terminal of the switches (e.g., the switches S11 and S13) respectively receives the supply voltage V2 and the supply voltage V4, the parasitic capacitance of the switches is measured. The measured capacitance of the measured DUT is calculated based on one or more of the formulae (6), (7), (8), (9) as previously discussed. The system 3 is able to measure the plurality of DUTs (e.g., an array of DUTs) and thus the measurement time for the capacitance can be reduced.

Figure 6:
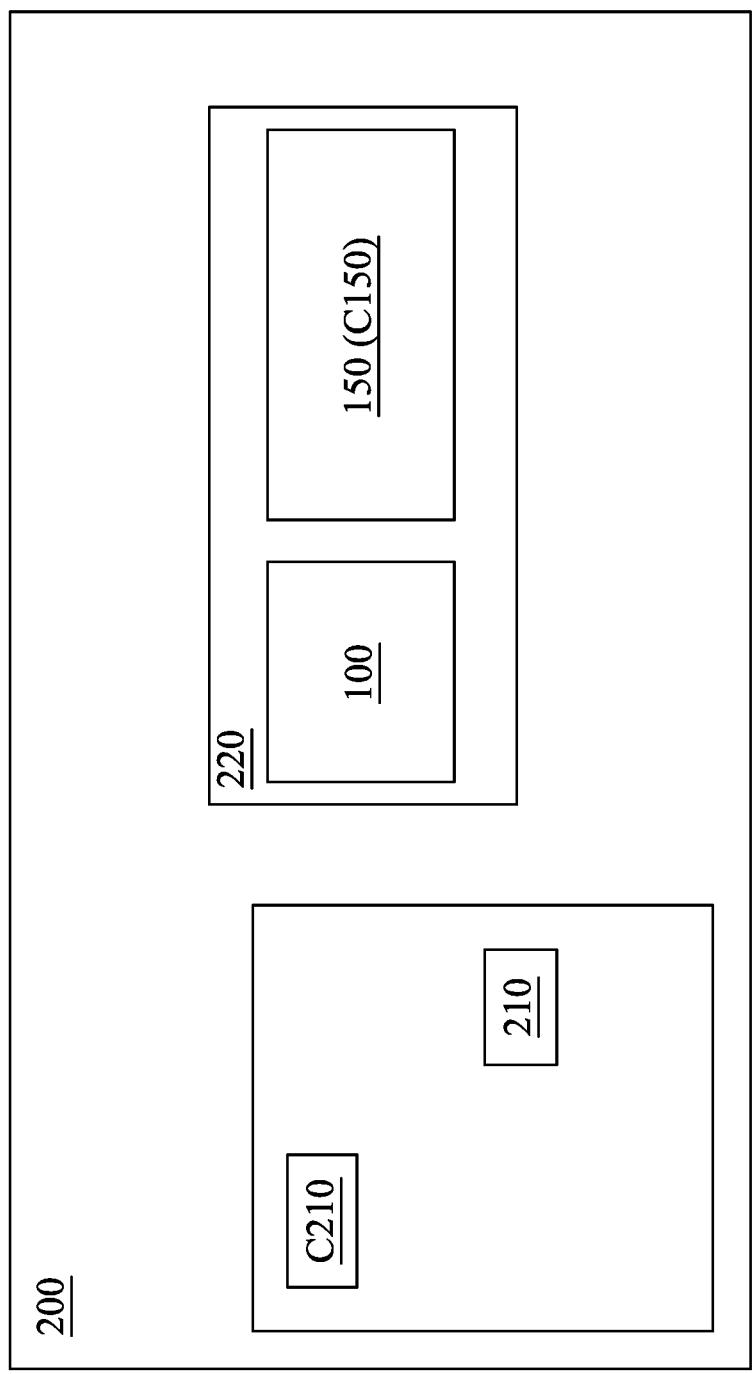
FIG. 6 is a block diagram of a semiconductor chip including a system of measuring capacitance of a DUT, in accordance with some embodiments.

FIG. 6 is a block diagram of a semiconductor chip 200 including a system 220 of measuring capacitor C150 of a DUT 150, in accordance with some embodiments. The system 220 may include elements of one of the systems 1, 2, or 3. The capacitor C150 of the DUT 150 can be measured by the system 220 in similar measurement configurations as disclosed in FIGS. 1-5. The semiconductor chip 200 includes a circuit region 210 having a capacitor C210. The capacitor C210 of the circuit region 210 and the capacitor C150 of the DUT 150 may have the same structure, layout, and process flow. In other words, the capacitor C150 of the DUT 150 mimics the design of the capacitor C210 of the circuit region 210. As such, the capacitor C210 of the circuit region 210 can be obtained through the measurement of the capacitor C150 of the DUT 150 by the system 220. The system 220 can be easily implemented into the semiconductor chip 200 with low power consumption and small area penalty.

In some embodiments, the circuit region 210 may include an SAR ADC and the capacitor C210 may include the capacitance of an array of capacitors that mimics the array of capacitors of the SAR ADC. The differential non-linearity (DNL) of the SAR ADC can be obtain by measuring the capacitance of the DUT 150 based on the following formula (10), rather than directing measuring the circuit region. The variation of the DNL can be improved by using the weighting factor (α*β−1).

$$DNL = \frac{C_{n+1} - C_n}{C_{total}/2^N} - 1 \qquad (10)$$

Cn+1 and Cn represent the capacitance of the $n+1_{th}$ and $n_{th}$ capacitor of the SAR ADC and $C_{total}$ represents the total capacitance of all of the capacitors of the SAR ADC.

Figure 7:
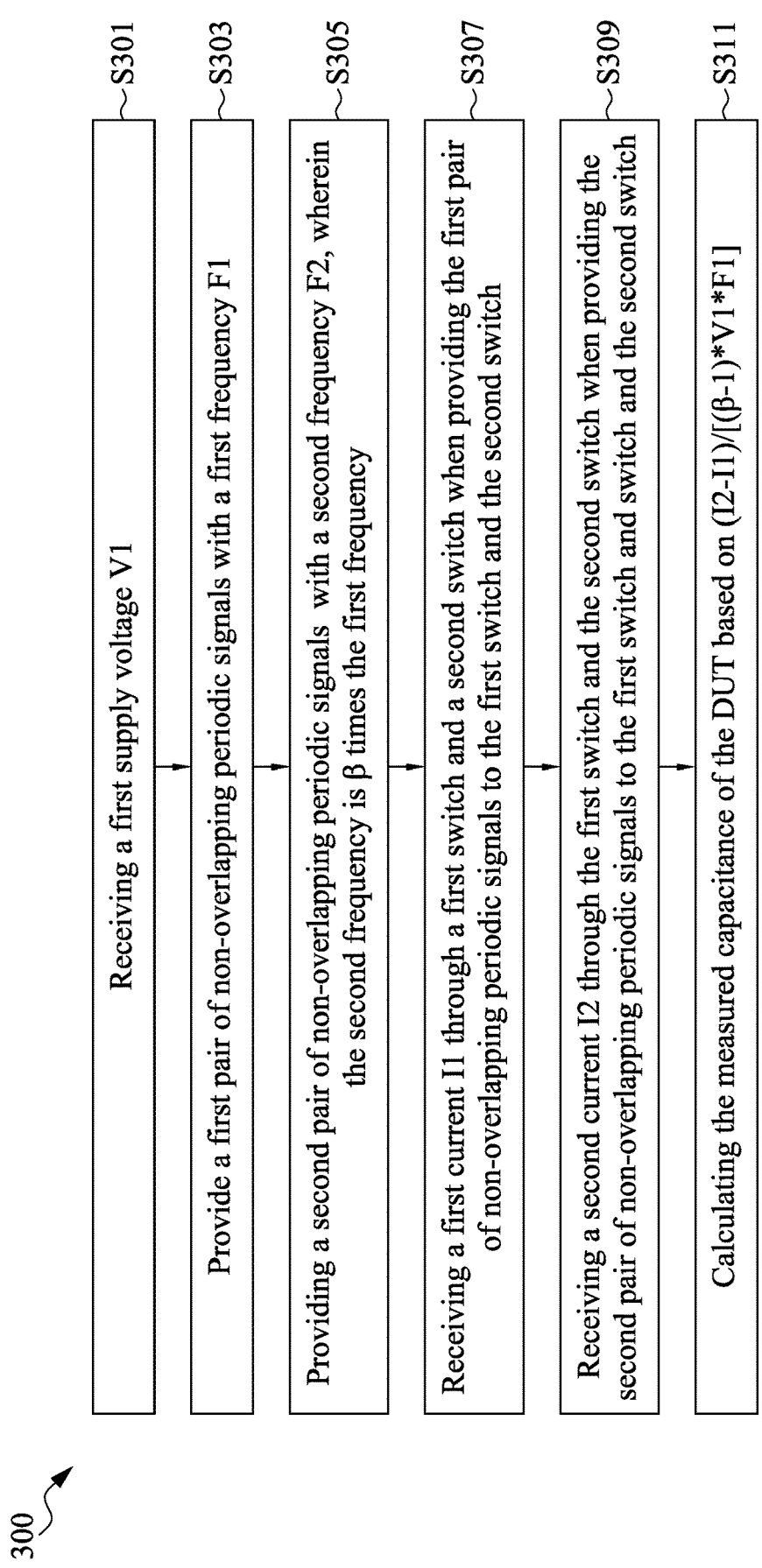
FIG. 7 is a flowchart showing a method of measuring capacitance of a DUT, in accordance with some embodiments.

FIG. 7 is a flowchart showing a method 300 of measuring capacitance of a DUT, in accordance with some embodiments. In some embodiments, this method can be conducted by a system of measuring capacitance of a DUT. In some embodiments, the method can be performed by the system illustrated in FIGS. 1-6.

In operation S301, the method 300 begins with receiving a first supply voltage V1, e.g., by a first switch S11. The first supply voltage V1 may come from an external equipment, e.g., an oscilloscope.

In operation S303, the method 300 continues with providing a first pair of non-overlapping periodic signals ψ1 and ψ2 with a first frequency F1.

In operation S305, the method 300 continues with providing a second pair of non-overlapping periodic signals ψ3 and ψ4 with a second frequency F2, wherein the second frequency F2 is β times the first frequency F1. The providing of the first pair of non-overlapping periodic signals ψ1 and ψ2 and/or the second pair of non-overlapping periodic signals ψ3 and ψ4 may include generating a clock having the second frequency F2; dividing the second frequency F2 into the first frequency F1 to generate a frequency-divided clock having the first frequency F1; and/or determining which one of the frequency-divided clock and the clock is output.

In operation S307, the method 300 continues receiving a first current I1 through the first switch S11 and a second switch (e.g., the switch S12) when providing the first pair of non-overlapping periodic signals ψ1 and ψ2 to the first switch S11 and the second switch S12. In some embodiments, the first current I1 may be an average current during a plurality of charge-discharge cycles of the capacitance of the DUT. In some embodiments, the first current I1 is received by a current meter or an oscilloscope.

In operation S309, the method 300 continues receiving a second current I2 through the first switch S11 and the second switch S12 when providing the second pair of non-overlapping periodic signals ψ3 and ψ4 to the first switch S11 and the second switch S12. In some embodiments, the second current I2 may be an average current during a plurality of charge-discharge cycles of the capacitance of the DUT. In some embodiments, the second current I2 is received by a current meter or an oscilloscope.

In operation S311, the method 300 continues calculating the measured capacitance of the DUT based on $(I2-I1)/[(\beta-1)*V1*F1]$. The calculation of the measured capacitance of the DUT may include one or more of the formulae (1)-(7). The capacitance of the DUT 50 can be accurately obtained or measured.

The method 300 is merely an example, and is not intended to limit the present disclosure beyond what is explicitly recited in the claims. Additional operations can be provided before, during, or after each operation of the method 300, and some operations described can be replaced, eliminated, or reordered for additional embodiments of the method. In some embodiments, the method 300 can include further operations not depicted in FIG. 7. In some embodiments, the method 300 can include one or more operations depicted in FIG. 7.

Figure 8:
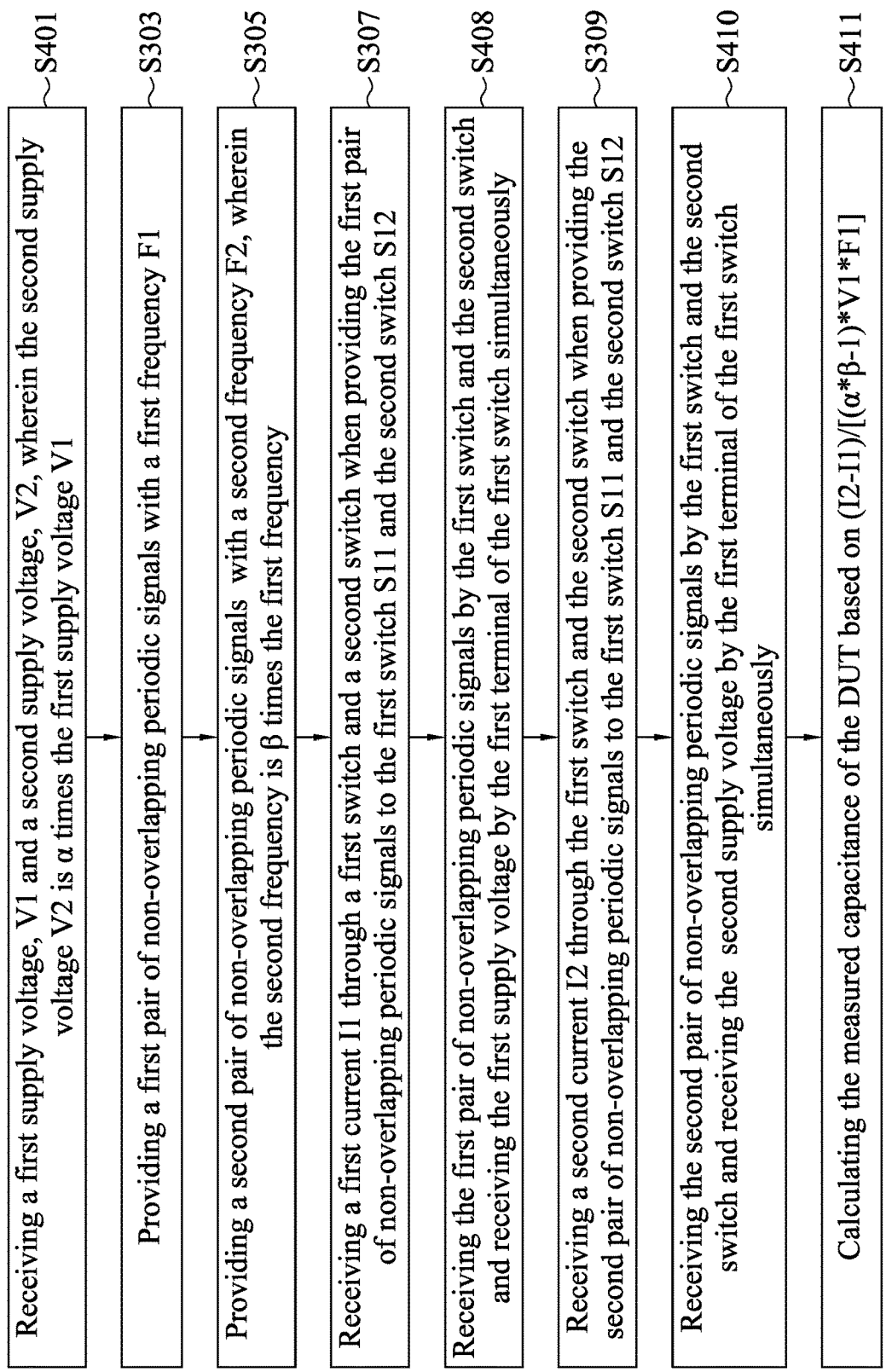
FIG. 8 is a flowchart showing a method of measuring capacitance of a DUT, in accordance with some embodiments.

FIG. 8 is a flowchart showing a method 400 of measuring capacitance of a DUT, in accordance with some embodiments. In some embodiments, this method can be conducted by a system of measuring capacitance of a DUT. In some embodiments, the method can be performed by the system illustrated in FIGS. 1-6. The method 400 of FIG. 8 is similar to the method 300 of FIG. 7, with differences therebetween as follows.

In operation S401, the method 400 begins with receiving a first supply voltage V1 and a second supply voltage V2, wherein the second supply voltage V2 is α times the first supply voltage V1.

The method 400 continues operations S303, S305, and S307 as illustrated in FIG. 7.

In operation S408, the method 400 continues receiving the first pair of non-overlapping periodic signals ψ1 and ψ2 by the first switch S11 and the second switch S12 and receiving the first supply voltage V1 by the first terminal of the first switch S11 simultaneously. In some embodiments, receiving the first pair of non-overlapping periodic signals ψ1 and ψ2 by the first switch S11 and the second switch S12 and receiving the first supply voltage V1 by the first terminal of the first switch S11 overlap in a time domain. In some embodiments, when receiving the first pair of non-overlapping periodic signals ψ1 and ψ2 by the first switch S11 and the second switch S12, controlling the first supply voltage V1 to be applied on or received by the first terminal of the first switch S11.

The method 400 continues operation S309 as illustrated in FIG. 7.

In operation S410, the method 400 continues receiving the second pair of non-overlapping periodic signals ψ3 and ψ4 by the first switch S11 and the second switch S12 and receiving the second supply voltage V2 by the first terminal of the first switch S11 simultaneously. In some embodiments, receiving the second pair of non-overlapping periodic signals ψ3 and ψ4 by the first switch S11 and the second switch S12 and receiving the second supply voltage V2 by the first terminal of the first switch S1 overlap in a time domain. In some embodiments, when receiving the second pair of non-overlapping periodic signals ψ3 and ψ4 by the first switch S111 and the second switch S12, controlling the second supply voltage V2 to be applied on or received by the first terminal of the first switch S11.

In operation S411, the method 400 continues calculating the measured capacitance of the DUT based on $(I2-I1)/[(\alpha*\beta-1)*V1*F1]$. The calculation of the measured capacitance of the DUT may include one or more of the formulae (1)-(8). The capacitance of the DUT 50 can be accurately obtained or measured.

The method 400 is merely an example, and is not intended to limit the present disclosure beyond what is explicitly recited in the claims. Additional operations can be provided before, during, or after each operation of the method 400, and some operations described can be replaced, eliminated, or reordered for additional embodiments of the method. In some embodiments, the method 400 can include further operations not depicted in FIG. 8. In some embodiments, the method 400 can include one or more operations depicted in FIG. 8.

Figure 9:
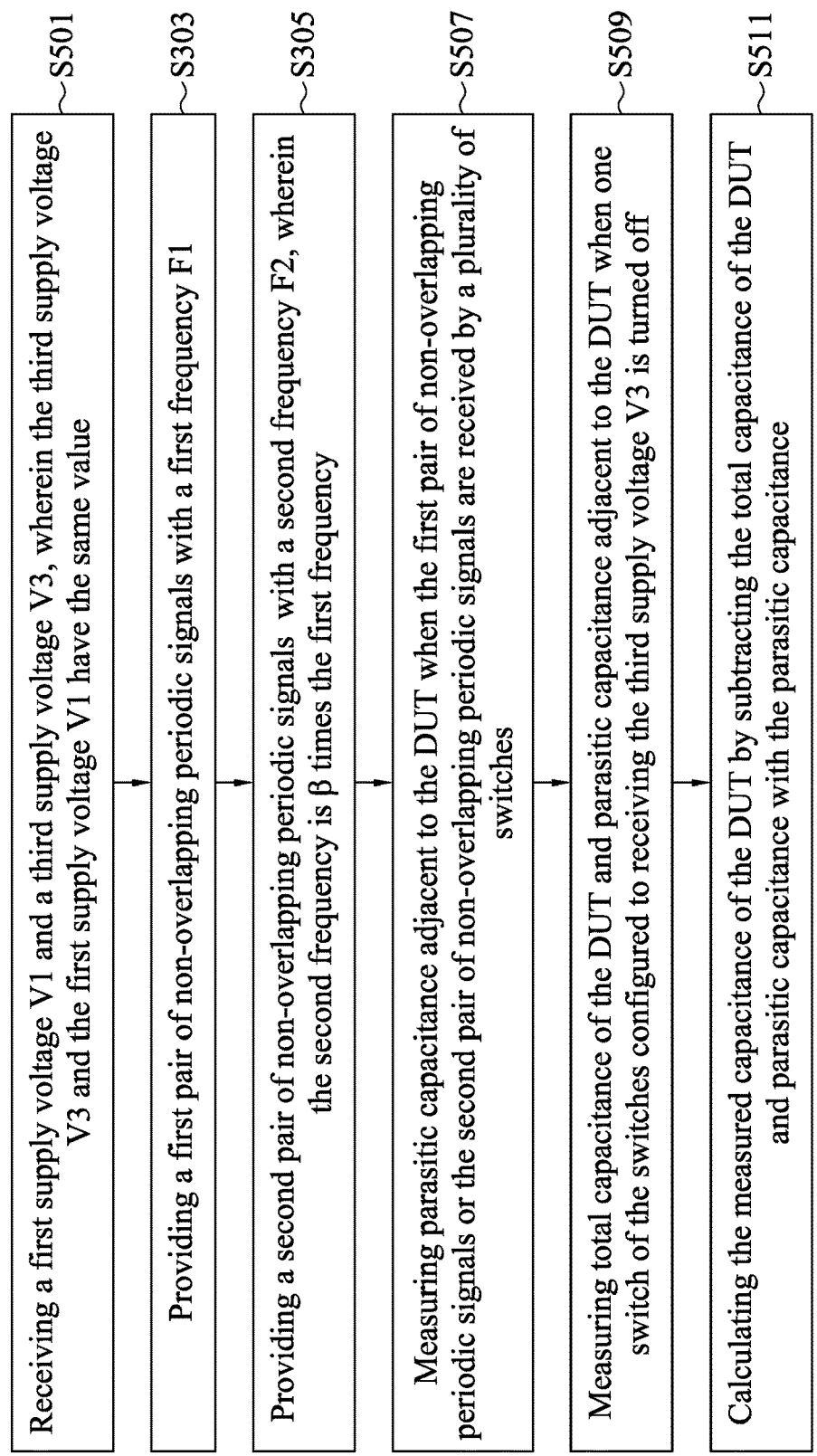
FIG. 9 is a flowchart showing a method of measuring capacitance of a DUT, in accordance with some embodiments.

FIG. 9 is a flowchart showing a method 500 of measuring capacitance of a DUT, in accordance with some embodiments. In some embodiments, this method can be conducted by a system measuring capacitance of a DUT. In some embodiments, the method can be performed by the system illustrated in FIGS. 1-6. The method 500 of FIG. 9 is similar to the method 300 of FIG. 7, with differences therebetween as follows.

In operation S501, the method 500 begins with receiving a first supply voltage V1 and a third supply voltage V3, wherein the first supply voltage V1 and the third supply voltage V3 have the same value. The first supply voltage V1 and the third supply voltage V3 may come from different sources.

The method 500 continues operations S303 and S305 as illustrated in FIG. 7.

In operation S507, the method 500 continues measuring parasitic capacitance adjacent to the DUT when the first pair of non-overlapping periodic signals ψ1 and ψ2 or the second pair of non-overlapping periodic signals ψ3 and 44 are received by a plurality of switches (e.g., the switches S11, S12, S13, and S14). The measurement of operation S507 may include the measurement as presented in the configurations 2A and 2B of FIGS. 3 and 4.

In operation S509, the method 500 continues measuring total capacitance of the DUT and parasitic capacitance adjacent to the DUT when one switch (e.g., the switch S13) of the switches configured to receiving the third supply voltage V3 is turned off. The measurement of operation S509 may include the measurement as presented in the configurations 2A and 2B of FIGS. 3 and 4.

In operation S511, the method 500 continues calculating the measured capacitance of the DUT by subtracting the total capacitance of the DUT and parasitic capacitance with the parasitic capacitance. The influence of the parasitic capacitance adjacent to the DUT can be minimized or eliminated.

The method 500 is merely an example, and is not intended to limit the present disclosure beyond what is explicitly recited in the claims. Additional operations can be provided before, during, or after each operation of the method 500, and some operations described can be replaced, eliminated, or reordered for additional embodiments of the method. In some embodiments, the method 500 can include further operations not depicted in FIG. 9. In some embodiments, the method 500 can include one or more operations depicted in FIG. 9.

According to some embodiments, a system of measuring capacitance of a device-under-test (DUT) is provided. The system includes first switch, second switch, and a capacitance measurement device. The first switch has a first terminal configured to receive a first supply voltage, V1, and a second terminal electrically connected to a first terminal of the DUT. The second switch has a first terminal electrically connected to the first terminal of the DUT and a second terminal electrically connected to ground. The capacitance measurement device is configured to provide a first pair of non-overlapping periodic signals with a first frequency, F1, and a second pair of non-overlapping periodic signals with a second frequency, F2. The second frequency is β times the first frequency. When the first switch and the second switch receive the first pair of non-overlapping periodic signals, a first current, I1, is transmitted through the first switch and the second switch. When the first switch and the second switch receive the second pair of non-overlapping periodic signals, a second current, I2, is transmitted through the first switch and the second switch. The measured capacitance of the DUT is calculated based on $(I2-I1)/[(\beta-1)*V1*F1]$.

According to other embodiments, a system of measuring capacitance of a device-under-test is provided. The system includes a first switch, a second switch, a third switch, and a fourth switch. The first switch has a first terminal configured to receive a first supply voltage V1, and a second terminal electrically connected to a first terminal of the DUT. The second switch has a first terminal electrically connected to the first terminal of the DUT and a second terminal electrically connected to ground. The third switch has a first terminal configured to receive a second supply voltage, V3, and a second terminal electrically connected with a second terminal the DUT. The fourth switch has a first terminal electrically connected to the second terminal of the DUT and a second terminal electrically connected to ground.

According to other embodiments, a system of measuring capacitance of a plurality of device-under-test (DUTs) is provided. The system includes a plurality of first switches, a plurality of second switches, a capacitance measurement device, and a controller. The plurality of first switches each has a first terminal configured to receive a first supply voltage, V1, and a second terminal electrically connected to a first terminal of a corresponding one of DUTs. The plurality of second switches each has a first terminal electrically connected to the first terminal of the corresponding DUT and a second terminal electrically connected to ground. The capacitance measurement device is configured to provide a first pair of non-overlapping periodic signals with a first frequency, F1, and a second pair of non-overlapping periodic signals with a second frequency, F2, The second frequency is β times the first frequency. The controller is configured to determine a DUT to be measured from the DUTs. When the first switch and second switch corresponding to the measured DUT receive the first pair of non-overlapping periodic signals, a first current, I1, is transmitted through the first switch and the second switch. When the first switch and second switch corresponding to the measured DUT receive the second pair of non-overlapping periodic signals, a second current, I2, is transmitted through the first switch and the second switch. The measured capacitance of the measured DUT is calculated based on $(I2-I1)/[(\beta-1)*V1*F1]$.

According to other embodiments, a method of measuring capacitance of a device-under-test (DUT) is provided. The method includes receiving a first supply voltage, V1 and a second supply voltage, V2, wherein V2 is α times V1, providing a first pair of non-overlapping periodic signals with a first frequency F1, providing a second pair of non-overlapping periodic signals with a second frequency F2, wherein F2 is β times F1, receiving a first current, I1 through a first switch and a second switch when providing the first pair of non-overlapping periodic signals by the first switch, receiving a second current I2 through the first switch and the second switch when providing the second pair of non-overlapping periodic signals by the first switch, and calculating the measured capacitance of the DUT based on $(I2-I1)/[(\beta-1)*V1*F1]$.

The methods and features of the present disclosure have been sufficiently described in the above examples and descriptions. It should be understood that any modifications or changes without departing from the spirit of the present disclosure are intended to be covered in the protection scope of the present disclosure.

Moreover, the scope of the present application in not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, may be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A system of measuring capacitance of a device-under-test (DUT), comprising:
    a first switch having a first terminal configured to receive a first supply voltage, V1, and a second terminal electrically connected to a first terminal of the DUT;
    a second switch having a first terminal electrically connected to the first terminal of the DUT and a second terminal electrically connected to ground; and
    a capacitance measurement device configured to provide a first pair of non-overlapping periodic signals with a first frequency, F1, and a second pair of non-overlapping periodic signals with a second frequency, F2, wherein the second frequency is $\beta$ times the first frequency,
    wherein, when the first switch and the second switch receive the first pair of non-overlapping periodic signals, a first current, I1, is transmitted through the first switch and the second switch,
    wherein, when the first switch and the second switch receive the second pair of non-overlapping periodic signals, a second current, I2, is transmitted through the first switch and the second switch, and
    wherein the measured capacitance of the DUT is calculated based on $(I2-I1)/[(\beta-1)*V1*F1]$.

2. The system of claim 1, wherein the capacitance measurement device comprises a clock generator configured to generate a clock having the second frequency.

3. The system of claim 2, wherein the capacitance measurement device comprises a frequency divider configured to divide the second frequency into the first frequency to generate a frequency-divided clock having the first frequency.

4. The system of claim 3, wherein the capacitance measurement device comprises a multiplexer having a first input terminal receiving the frequency-divided clock and a second input terminal receiving the clock.

5. The system of claim 4, wherein the multiplexer is configured to determine which one of the frequency-divided clock and the clock is output, and wherein:
    the multiplexer, upon receipt of a first control signal, outputs the frequency-divided clock, and
    the multiplexer, upon receipt of a second control signal, outputs the clock.

6. The system of claim 5, wherein the capacitance measurement device comprises a phase-shifting module connected to the multiplexer, wherein:
    when receiving the frequency-divided clock from the multiplexer, the phase-shifting module generates the first pair of non-overlapping periodic signals, and
    when receiving the clock from the multiplexer, the phase-shifting module generates the second pair of non-overlapping periodic signals.

7. The system of claim 1, wherein the first terminal of the first switch is further configured to receive a second supply voltage, V2, wherein V2 is $\alpha$ times V1,
    wherein, when the first switch and the second switch receive the first pair of non-overlapping periodic signals, the first supply voltage is received by the first terminal of the first switch,
    wherein, when the first switch and the second switch receive the second pair of non-overlapping periodic signals, the second supply voltage is received by the first terminal of the first switch,
    wherein the measured capacitance of the DUT is calculated based on $(I2-I1)/[(\alpha*\beta-1)*V1*F1]$.

8. The system of claim 7, wherein the error in measurement of the capacitance of the DUT is less than 10% when $\alpha$ and $\beta$ are set to be 10.

9. The system of claim 1, further comprising:
    a third switch electrically connected with a second terminal the DUT; and
    a fourth switch having a first terminal electrically connected to the second terminal of the DUT and a second terminal electrically connected to the ground,
    wherein, when the third switch is turned off and the fourth switch is turned on, the measured capacitance of the DUT includes the capacitance of parasitic capacitors of the first switch and the second switch.

10. The system of claim 9, wherein the third switch has a first terminal configured to receive a third supply voltage and a second terminal electrically connected to the second terminal of the DUT, wherein, when the first switch, the second switch, the third switch, and the fourth switch receive the first pair of non-overlapping periodic signals or a second pair of non-overlapping periodic signals, the capacitance of the parasitic capacitors of the first switch and the second switch is measured.

11. The system of claim 10, wherein the measured capacitance of the DUT is corrected by subtracting the capacitance of the parasitic capacitors of the first switch and the second switch.

12. The system of claim 1, wherein the first pair of the non-overlapping periodic signals includes a first periodic signal and a second periodic signal running at the first frequency, and wherein a plurality of first pulses of the first periodic signal and a plurality of second pulses of the first periodic signal are non-overlapping in time domain.

13. A system of measuring capacitance of a plurality of device-under-test (DUTs), comprising:
    a plurality of first switches each have a first terminal configured to receive a first supply voltage, V1, and a second terminal electrically connected to a first terminal of a corresponding one of DUTs;
    a plurality of second switches each have a first terminal electrically connected to the first terminal of the corresponding DUT and a second terminal electrically connected to ground;
    a capacitance measurement device configured to provide a first pair of non-overlapping periodic signals with a first frequency, F1, and a second pair of non-overlapping periodic signals with a second frequency, F2, wherein the second frequency is $\beta$ times the first frequency; and
    a controller configured to determine a DUT to be measured from the DUTs,
    wherein, when the first switch and second switch corresponding to the measured DUT receive the first pair of non-overlapping periodic signals, a first current, I1, is transmitted through the first switch and the second switch,
    wherein, when the first switch and second switch corresponding to the measured DUT receive the second pair of non-overlapping periodic signals, a second current, I2, is transmitted through the first switch and the second switch, and
    wherein the measured capacitance of the measured DUT is calculated based on $(I2-I1)/[(\beta-1)*V1*F1]$.

14. The system of claim 13, wherein the first terminal of each of the first switches is configured to receive a second supply voltage, V2, wherein V2 is $\alpha$ times V1, wherein, when the first switch and second switch corresponding to the measured DUT receive the first pair of non-overlapping periodic signals, the first supply voltage is received by the first terminal of the corresponding first switch, wherein, when the first switch and second switch corresponding to the measured DUT receive the second pair of non-overlapping periodic signals, the second supply voltage is received by the first terminal of the corresponding first switch, wherein the measured capacitance of the measured DUT is calculated based on $(I2-I1)/[(\alpha*\beta-1)*V1*F1]$.

15. A method of measuring capacitance of a device-under-test (DUT), comprising:
   receiving a first supply voltage V1 by a first switch of a measuring system;
   providing a first pair of non-overlapping periodic signals with a first frequency F1 by a capacitance measurement device of the measuring system;
   providing a second pair of non-overlapping periodic signals with a second frequency F2 by the capacitance measurement device, wherein the second frequency is $\beta$ times the first frequency;
   receiving a first current I1 through the first switch and a second switch of the measuring system when providing the first pair of non-overlapping periodic signals to the first switch and the second switch;
   receiving a second current I2 through the first switch and the second switch when providing the second pair of non-overlapping periodic signals to the first switch and the second switch; and
   calculating the measured capacitance of the DUT based on $(I2-I1)/[(\beta-1)*V1*F1]$.

16. The method of claim 15, further comprising generating a clock having the second frequency F2 by a clock generator of the capacitance measurement device.

17. The method of claim 16, further comprising dividing the second frequency F2 into the first frequency F1 to generate a frequency-divided clock having the first frequency F1, by a frequency divider of the capacitance measurement device.

18. The method of claim 17, further comprising determining which one of the frequency-divided clock and the clock is output.

19. The method of claim 15, further comprising:
   receiving a second supply voltage V2 by the first switch, wherein the second supply voltage V2 is $\alpha$ times the first supply voltage V1,
   receiving the first pair of non-overlapping periodic signals by the first switch and the second switch and receiving the first supply voltage V1 by a first terminal of the first switch simultaneously;
   receiving the second pair of non-overlapping periodic signals by the first switch and the second switch and receiving the second supply voltage V2 by the first terminal of the first switch simultaneously; and
   calculating the measured capacitance of the DUT based on $(I2-I1)/[(\alpha*\beta-1)*V1*F1]$.

20. The method of claim 19, wherein the error in measurement of the capacitance of the DUT is less than 10% when $\alpha$ and $\beta$ are set to be 10.

* * * * *